(12) United States Patent  (10) Patent No.: US 8,106,671 B2
Patterson  (45) Date of Patent: Jan. 31, 2012

(54) SOCKETLESS INTEGRATED CIRCUIT CONTACT CONNECTOR

(75) Inventor: Joseph Martin Patterson, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 243 days.

(21) Appl. No.: 12/541,058

(22) Filed: Aug. 13, 2009

(65) Prior Publication Data

US 2011/0031990 A1 Feb. 10, 2011

Related U.S. Application Data

(63) Continuation-in-part of application No. 12/535,533, filed on Aug. 4, 2009, now Pat. No. 7,768,283.

(51) Int. Cl.
*G01R 31/20* (2006.01)
*G01R 1/067* (2006.01)
*G01R 31/26* (2006.01)

(52) U.S. Cl. .......... 324/754.01; 324/755.11; 324/762.01

(58) Field of Classification Search ............. 324/757.02–757.07, 762.01–762.1, 324/754.01–754.29, 755.01–755.11, 72.5; 438/14–18
See application file for complete search history.

(56) References Cited

U.S. PATENT DOCUMENTS

| 4,977,370 | A * | 12/1990 | Andrews ................. 324/754.08 |
| 6,469,530 | B1 * | 10/2002 | Johnson et al. .......... 324/750.25 |
| 6,791,345 | B2 * | 9/2004 | Maruyama et al. ...... 324/754.08 |

* cited by examiner

*Primary Examiner* — Huy Q Phan
*Assistant Examiner* — Tung X Nguyen
(74) *Attorney, Agent, or Firm* — Law Office of Gerald Maliszewski; Gerald Maliszewski

(57) ABSTRACT

A socketless integrated circuit (IC) contact connector is provided with an electrically conductive support post. An electrically conductive spring has a first end connected to the post, and a second end. An electrically conductive first wire has a first end connected to the spring second end, and a second end. An electrically conductive loop with a loop neck is connected to the first wire second end. Typically, the loop is formed in the first wire second end. The spring and loop work in cooperation to engage an IC contact.

16 Claims, 8 Drawing Sheets

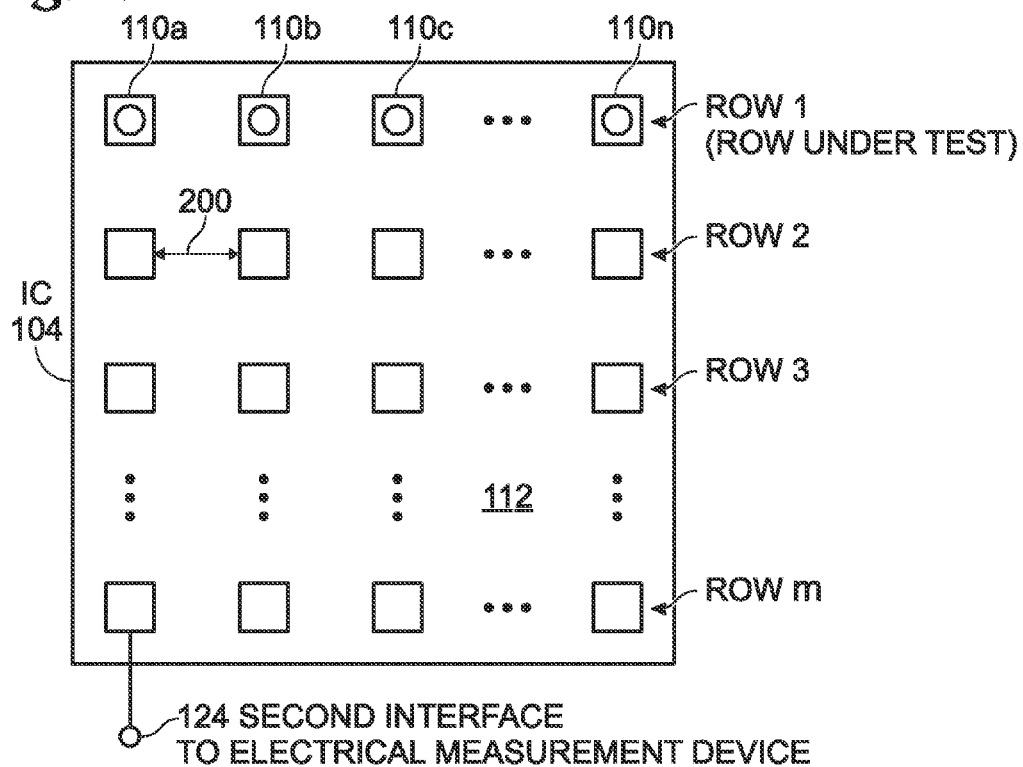
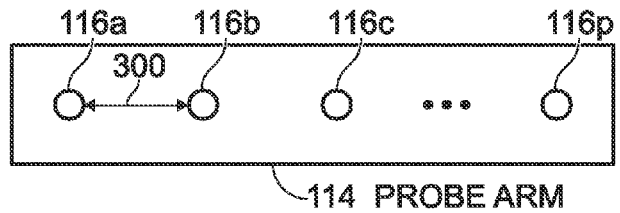

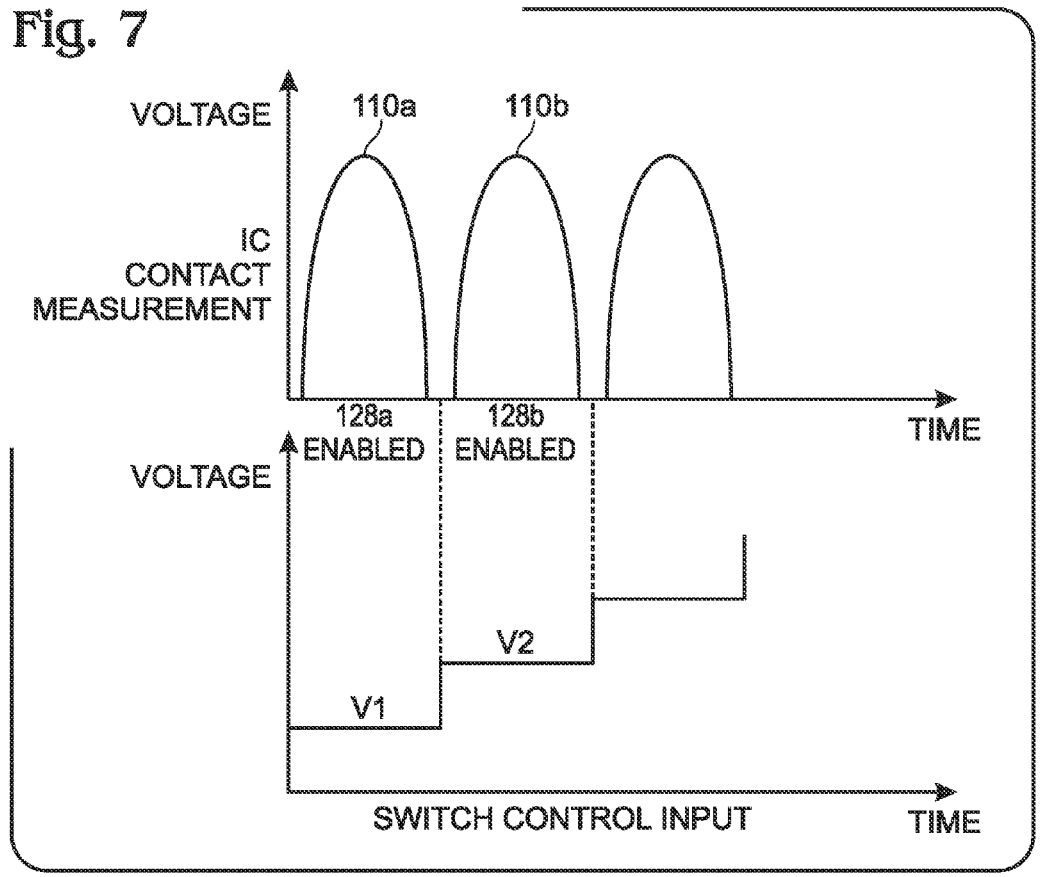
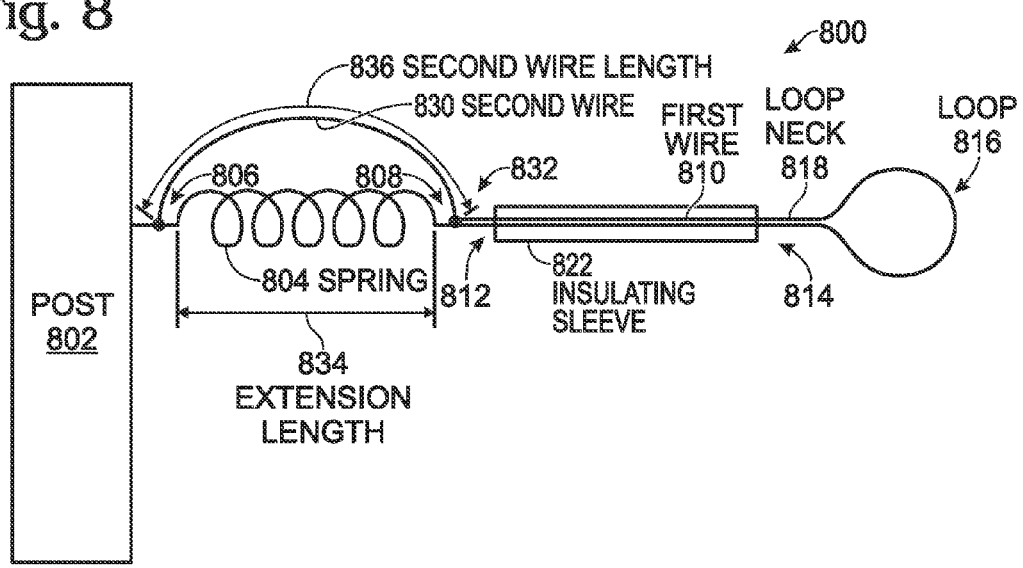

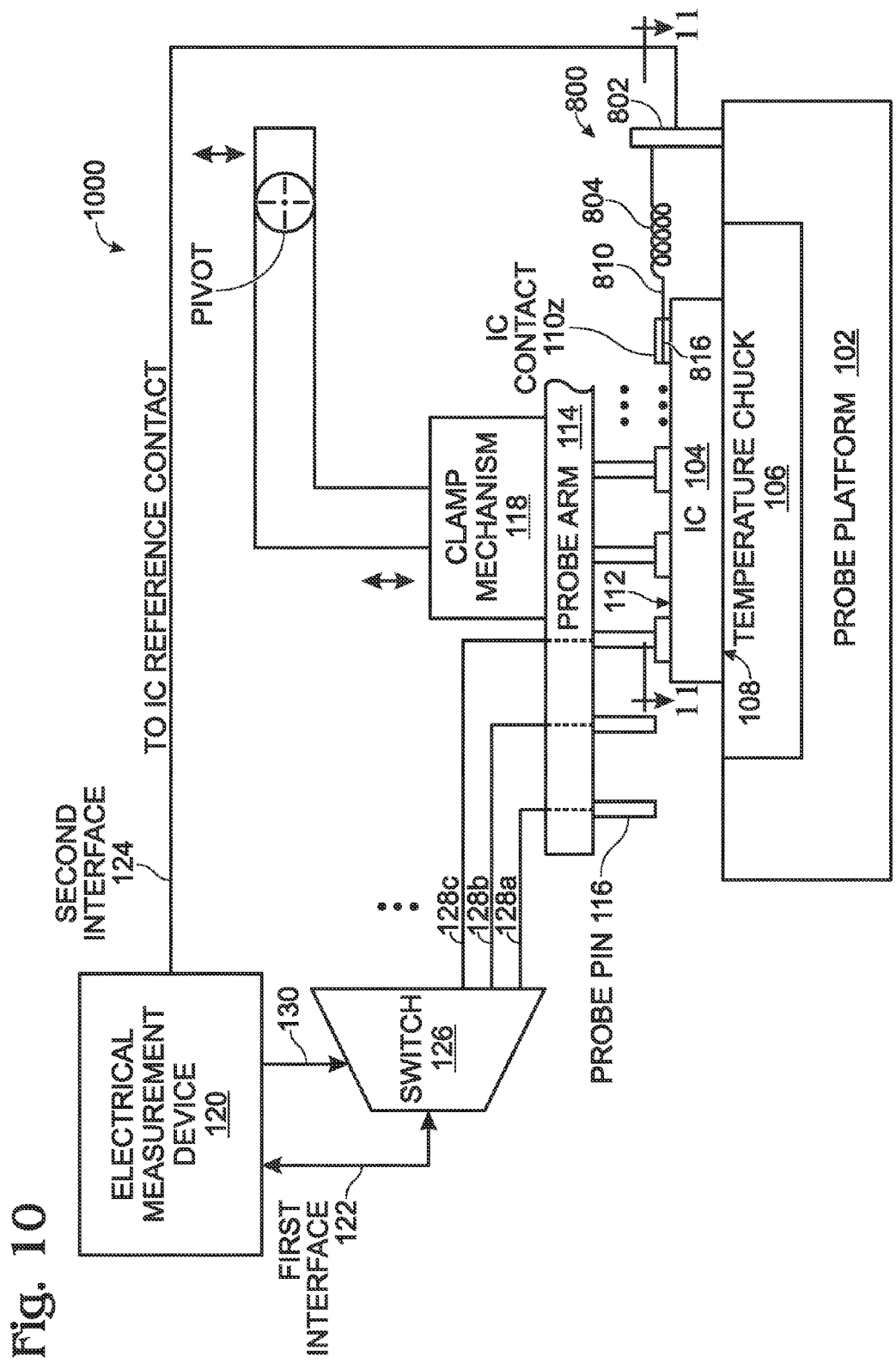

SOCKETLESS INTEGRATED CIRCUIT CONTACT CONNECTOR

RELATED APPLICATIONS

This application is a Continuation-in-Part of an application entitled, UNIVERSAL SOCKETLESS TEST FIXTURE, invented by Joseph Patterson, Ser. No. 12/535,533, filed Aug. 4, 2009 now U.S. Pat. No. 7,768,283, which is incorporated herein by reference.

BACKGROUND OF THE INVENTION

1. Field of the Invention

This invention generally relates to integrated circuit (IC) test fixtures and, more particularly, to a universal socketless test fixture with an associated IC contact connector.

2. Description of the Related Art

As noted in U.S. Pat. No. 7,554,206, it is valuable to test the electrical connections between the sockets of an IC in order to identify poor connections and defective active circuitry. IC devices have evolved from through-board pins to the surface mounting of a device to a socket and PCB. The input and output contacts of an IC chip are generally disposed in grid-like patterns that substantially cover a surface of the device or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

For example, surface mounting packages commonly include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Semiconductor chips are commonly provided in packages that facilitate handling of the chip during manufacture and during mounting of the chip on an external substrate such as a circuit board or other circuit panel. An IC that is designed to be surface mounted has pads, or flat conductive discs, on its packaging. Many packages include solder masses in the form of solder balls, typically about 1.0 mm and about 0.8 mm (40 mils and 30 mils) in pitch, and 0.4 to 0.5 mm in diameter, attached to the terminals of the package. A package having an array of solder balls projecting from its bottom surface is commonly referred to as a ball grid array or "BGA" package. For a BGA device there are solder bumps on the pads for connection with a BGA socket. The solder bumps typically fit into grips on a BGA socket for connection to a PCB. Other packages, referred to as land grid array or "LGA" packages are secured to the substrate by thin layers or lands (pads) formed from solder. The pads of an LGA require a socket containing springs or some other type of conductive trace to connect the device to the PCB.

In testing packaged devices, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture.

A socket is typically used to interface IC contacts to a test fixture. A socket may have a plastic body, metal contacts, and a metal lever or latch to temporary secure the IC to the socket—physically securing the IC under test, as well as causing an electrical connection between all the IC pins and the socket.

A test fixture may consist of an array of switch pairs, where one switch connects a single signal trace to a single power trace and the other switch connects the signal trace to a single ground trace. Multiple switch pairs are used to connect all signal traces to independent power and ground traces. Typically, the sockets make electric connections to all the device pins simultaneously. Automation of the process requires a relay/relay driver circuit for each device pin.

Conventionally, the test fixture uses a socket designed for the specific pin count and physical spacing of the package pins. However, these test fixture are often custom made and, therefore, expensive. Further, a test facility may require a multiplicity of sockets and interface boards for a large variety of package types. Finally, because of the cost of socket interfaces, it becomes prohibitively expensive to upgrade the electrical components of the test fixture, to support complicated test algorithms such as curve tracing. Alternately, more complicated testing may be supported through the use of a conventional curve tracer. Without a socket however, hand probing of each pair of device pins is required, which does not lend itself to efficient automated data collection on high pin count packages. A clip-on mechanism with a hock shaped wire is known to be used in connecting to individual IC contacts. However, the spring loading is within a rigid plastic housing that is too large to fit in the spaces between the BGA rows. Alternately, micromanipulators with needle probes must be used.

It would be advantageous if a socketless test fixture existed that permitted the testing of any type of IC connector grid array pattern.

It would be advantageous if the socketless test fixture could measure the electrical performance of IC contacts using a curve tracer.

It would be advantageous if electrical connections could be made to individual IC contacts without the use of micromanipulators.

SUMMARY OF THE INVENTION

Disclosed herein is a test fixture that provides a means to make contact to many pins of a packaged IC, without the use of a socket, permitting curve tracer analysis on all pins contacted and real-time interactive curve tracer analysis. The test fixture reduces the need for high pin-count sockets. By simplifying the automated curve tracer analysis process, the real-time examination of the characteristics is enabled. Thus, defects can be observed such as drift, intermittence, and noise, which are unstable and change in a short time frame. This analysis is not available with conventional fully automated curve trace analysis. Advantageously, a single-contact connector can be used with the above-mentioned socketless fixture to power or ground an IC under test.

The single-contact connector is made from a fine wire, an insulating sleeve, and a small spring. Both ends of the fine wire are inserted into an insulating sleeve, leaving a small loop of the wire extending out from the first end of the insulating sleeve. The wire ends at the second end of the insulating sleeve are connected to one end of a small coil spring. The other end of the coil spring is connected to a header post that can be plugged into a pin on a board or connector.

Accordingly, a socketless integrated circuit (IC) contact connector is provided with an electrically conductive support post. An electrically conductive spring has a first end connected to the post, and a second end. An electrically conductive first wire has a first end connected to the spring second end, and a second end. An electrically conductive loop with a loop neck is connected to the first wire second end. Typically, the loop is formed in the first wire second end. The spring and loop work in cooperation to engage an IC contact.

In one aspect, an electrical insulating sleeve overlies the first wire, and the loop has a diameter greater than an engaged ball grid array (BGA) IC contact diameter. In another aspect, the loop is a wire having a wire diameter less than the BGA diameter. The wire diameter permits the loop wire to be seated between the maximum diameter of the BGA contact and the IC surface, without slipping off. In another aspect, a second wire has a first end connected to the spring second end, and a second end connected to the post. The second wire provides a low impedance current path from the first wire to the post.

Additional details of the above-described IC contact connector and a universal socketless IC test fixture with contact connector are provided below.

BRIEF DESCRIPTION OF THE DRAWINGS

FIG. 2 is a plan view of the IC bottom surface showing m rows of IC contacts.

FIG. 3 is a plan view showing a row of probe pins mounted on the probe arm.

FIG. 7 is a diagram illustrating a variation in the relationship between the switch select signal and switch signal input.

FIG. 8 is a diagram of a socketless IC contact connector.

FIG. 10 is a diagram depicting a universal socketless IC test fixture with a contact connector.

DETAILED DESCRIPTION

Figure 1:
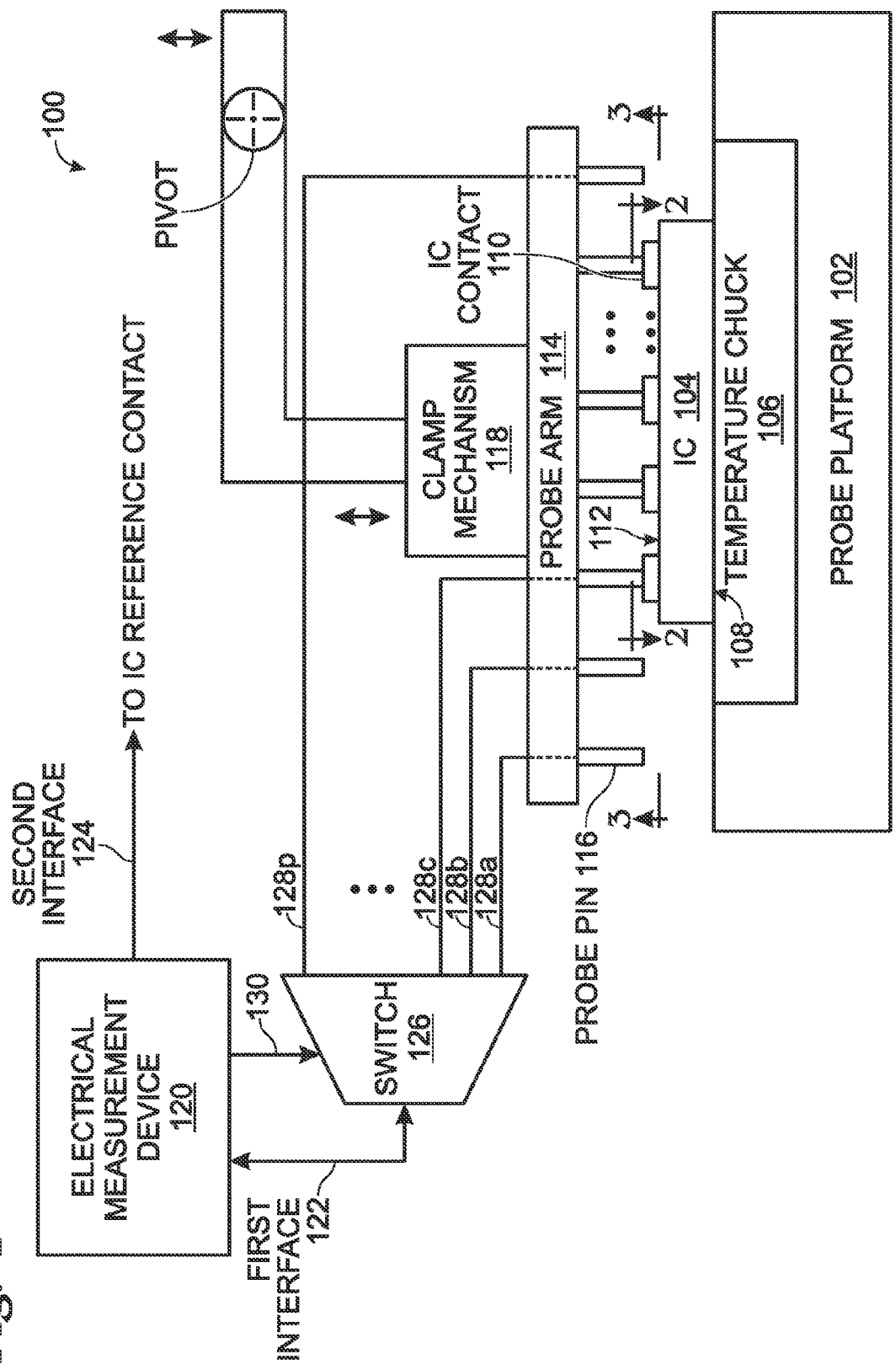
FIG. 1 is a schematic block diagram of a universal socketless integrated circuit (IC) electrical test fixture.

FIG. 1 is a schematic block diagram of a universal socketless integrated circuit (IC) electrical test fixture. The test fixture 100 comprises a probing platform 102 to accept an IC 104. In one aspect, the probe platform 102 is part of a heat sink, or includes a temperature chuck 106 to accept a top surface 108 of the IC 104. The temperature of the chuck 106 can be controlled to support environmental temperature testing of the IC 104. The IC 104 has electrical contacts 110 formed on a bottom surface 112 in an array of m rows, where each row includes n, or less contacts. A probe arm 114 includes p probe pins 116, where p is typically greater than, or equal to n. A spring-loaded pogo pin is one example of a probe pin. Note: n, m, and v are variables not limited to any particular value. When p is less than n, the probe arm position must be changed more often, if IC contact is to be tested.

FIG. 2 is a plan view of the IC bottom surface showing m rows of IC contacts. In row 1, contacts 110a through 110n are shown, with a spacing 200 between contacts.

FIG. 3 is a plan view showing a row of probe pins 116 mounted on the probe arm 114. The spacing 300 between the probe pins 116 about matches the spacing between IC contacts (see FIG. 2). As shown, the p probe pins are mounted in the probe arm in a straight row. However, other probe pin mounting arrangements would be possible.

Returning to FIG. 1, a clamping mechanism 118 is used to mechanically interface the probe arm probe pins 116 to a row of n IC contacts 110 under test. A number of suitable mechanisms can be adapted for this purpose, and the test fixture is not limited to any particular one. An electrical measurement device 120 has a first interface on line 122 that is connected to the p probe pins 116 of the probe arm to measure electrical characteristics associated with the IC contacts 110 under test. Some examples of electrical characteristics include current, voltage, real and imaginary impedances, and delay.

The probe arm 114, clamping mechanism 118, and probe platform 102 work in cooperation to electrically interface any row of the IC contacts with the electrical measurement device. That is, the clamping mechanism can be engaged and disengaged to so that each row of IC contacts can be tested in sequence. The test fixture is not limited to testing an IC with any particular array pattern. The only limitation is that the spacing between the IC contacts approximately match the spacing between probe pins. In one aspect, the probe arm 114, clamping mechanism 118, and probe platform 102 work in cooperation to automatically electrically interface every row of the IC contacts with the electrical measurement device, in succession. For example, the test fixture initially connects the probe arm to row 1 of IC contacts, and after completing testing, releases. After moving the probe arm or probe platform, the probe is applied to row 2 of the IC contacts. In that manner, the rows of IC contacts are tested in succession.

In one aspect as shown, the electrical measurement device 120 has a second interface on line 124 to supply a reference voltage to an IC reference contact 110, and the electrical characteristics of the IC contacts under test are measured with respect to the reference voltage. For example, the reference IC contact may be a power supply pin or ground. Alternately but not shown, the electrical measurement device 120 supplies a reference voltage, via the first interface on line 122, to one of the IC contacts under test, so that the electrical characteristics of the IC contacts under test are measured with respect to the reference voltage. In some aspects the second interface supplies both a ground and a power supply voltage, or a plurality of power supply voltages.

In one aspect, a second probe arm (not shown) may be used as the second interface to supply the reference voltage. The second probe may have p probe pins. The movement of the second probe may be independent of the first probe arm. That is, the second probe arm may be connected to any row of IC contacts, independent of row connected to the first probe arm. As explained below in the context of the first probe arm 114, a second probe arm may be associated with a switching mechanism, so that a variety of different reference voltages may be switched to a particular IC contact (probe pin), or so that a reference voltage may be selectively supplied to different IC contacts (probe pins) interfaced to the second probe arm.

In another aspect, the test fixture 100 further comprises a 1-to-p switch or multiplexer 126 having p signal inputs 128.

Figure 4:
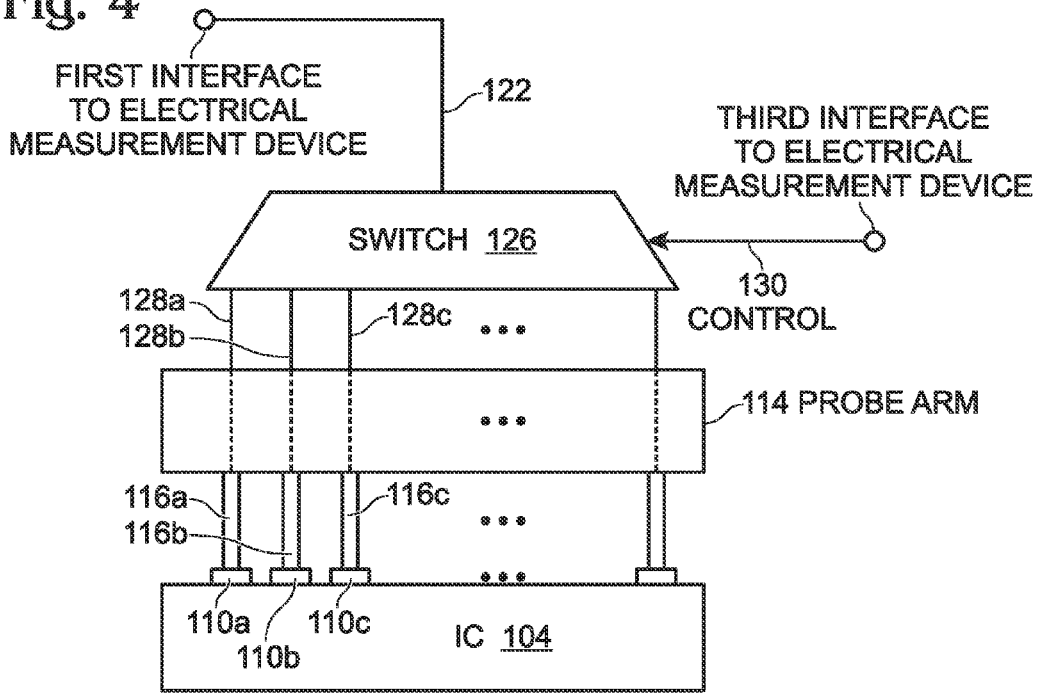
FIG. 4 is a schematic diagram depicting electrical connections to the switch.

FIG. 4 is a schematic diagram depicting electrical connections to the switch 126. Each signal input 128 is connected to a corresponding probe pin 116 in the probe arm. For example, signal input 128a is connected to probe pin 116a, signal input 128b to probe pin 116b, etc. The switch 126 has a control input on line 130 to accept a select signal for selecting a signal input. A signal output is connected to the electrical measurement device first interface on line 122. The electrical test device has a third interface on line 130 to supply the select signal.

Figure 5:
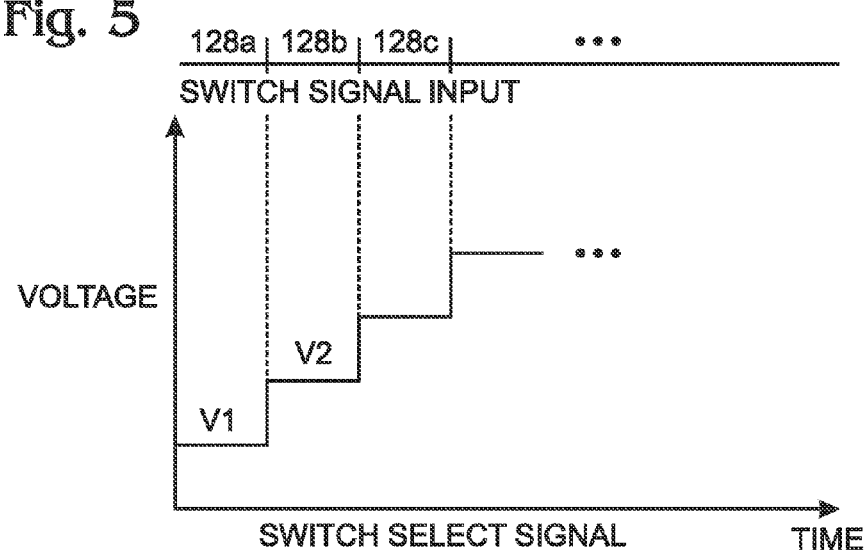
FIG. 5 is a diagram illustrating the relationship between the switch select signal and switch signal input.

FIG. 5 is a diagram illustrating the relationship between the switch select signal and switch signal input. In one aspect, the switch control input on line accepts a select signal with at least n possible voltage levels. The switch selects a signal input in response to the select signal voltage level. Other switch control mechanisms are known that could be used to enable the test fixture. For example, digital selection mechanisms are known. Advantageously as explained below, the stepped voltage selection mechanism permits the use of a curve tracer as a switch controller.

Figure 6:
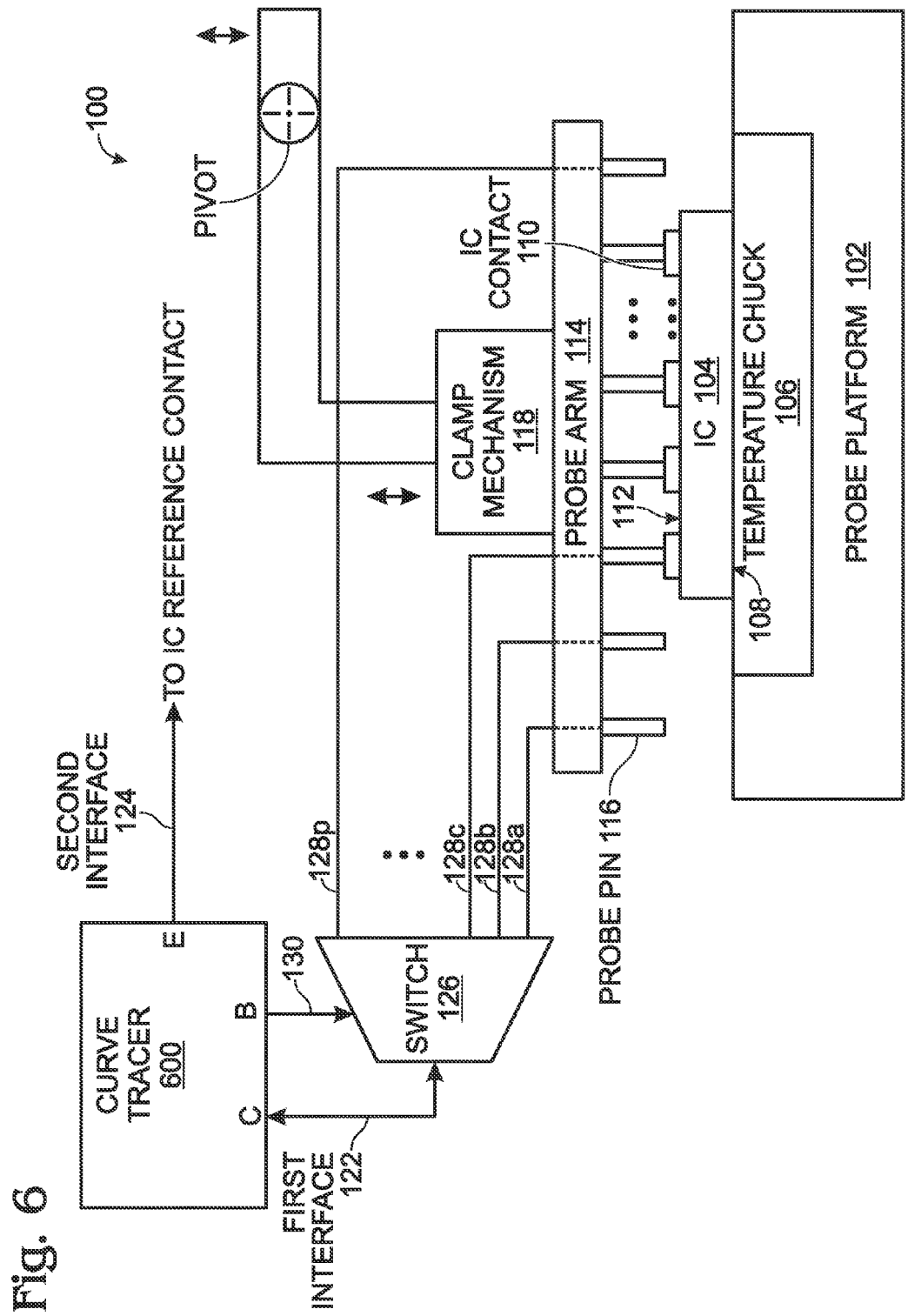
FIG. 6 is a schematic block diagram depicting the test fixture of FIG. 1, where the electrical test device is a curve tracer.

FIG. 6 is a schematic block diagram depicting the test fixture of FIG. 1, where the electrical test device is a curve tracer. In this aspect, the curve tracer 600 has a first interface on line 122 that is selected to be either the collector port (C) or the emitter (E) port. Typically, the collector port is used. Then, the unselected port (e.g., the emitter port) is used as the second interface on line 124, which supplies the reference voltage to one of the IC contacts. The base port (B) is the third interface on line 130, which supplies the select signal. In this manner, the electrical characteristics of the IC contacts under test are measured with respect to the reference voltage, sequentially in response to the select signals.

It should be understood that a curve tracer, as conventionally used in the step generator mode, can measure transistor collector electrical characteristics at a number of different base currents (voltages). Typically, the base current (voltage) is stepped, and the collector current (voltage) is measured at each step. As adapted for use with the test fixture of FIG. 6, each time the curve tracer "steps" to a new base current (voltage), a different signal input 128 on the switch is selected. Thus, for each base step, the curve tracer collector port measures electrical characteristics associated with a unique IC contact. For example, (see FIG. 5) in response to a base voltage v1, switch input 128a is enabled and the collector port of the curve tracer is able to measure the electrical characteristics associated with IC contact 110a via probe pin 116a (see FIG. 4). When the base voltage steps to v2, switch input 128b is enabled and the collector port of the curve tracer is able to measure the electrical characteristics associated with IC contact 110b via probe pin 116b.

A further advantage to using the curve tracer base port to control the external switching is the simultaneous storage of the measurement in the curve tracer memory. Most digital curve tracers have internal memory storage capability. The memory storage is synchronized with the step waveform on the base port. Thus, the external measurement on the collector or emitter port is synchronized with the base port signal, and kept is kept in a curve tracer internal memory. The external measurement can be recalled in response to referencing the base port voltage (switch control signal), which in turn, can be referenced to a particular IC contact.

FIG. 7 is a diagram illustrating a variation in the relationship between the switch select signal and switch signal input. In one aspect, the curve tracer selected port (e.g., collector port) supplies a plurality of electrical stimuli to each selected IC contact and measures a corresponding plurality of electrical characteristics for each IC contact under test. As shown for example, during the period associated with v1, switch input 128a is enabled and the collector port of the curve tracer is able to supply a sinusoidal waveform and measure the resulting waveform of electrical characteristics associated with IC contact 110a.

FIG. 8 is a diagram of a socketless IC contact connector. The connector 800 comprises an electrically conductive support post 802. An electrically conductive spring 804 has a first end 806 connected to the post 802, and a second end 808. An electrically conductive first wire 810 has a first end 812 connected to the spring second end 808, and a second end 814. An electrically conductive loop 816 has a loop neck 818 connected to the first wire second end 814. In one aspect, the loop 816 is formed by looping the first wire second end 814. Alternately, the loop may be a separate element connected (e.g., soldered) to the first wire. As shown, the first wire 810 doubles-back on itself after forming the loop 816, so that the wire head and tail are both connected to the spring second end 808. The spring 804 and loop 816 work in cooperation to engage an IC contact. In one aspect as shown, an electrical insulating sleeve 822 overlies the first wire 810.

Figure 9A:
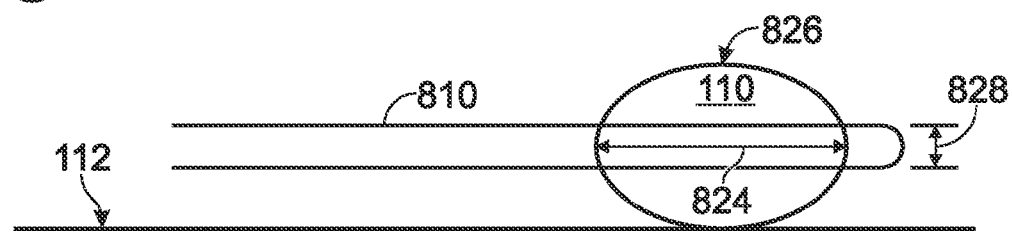
FIGS. 9A and 9B are detailed partial cross-sectional and plan views, respectively, of the connector loop engaged with an IC contact.
Figure 9B:
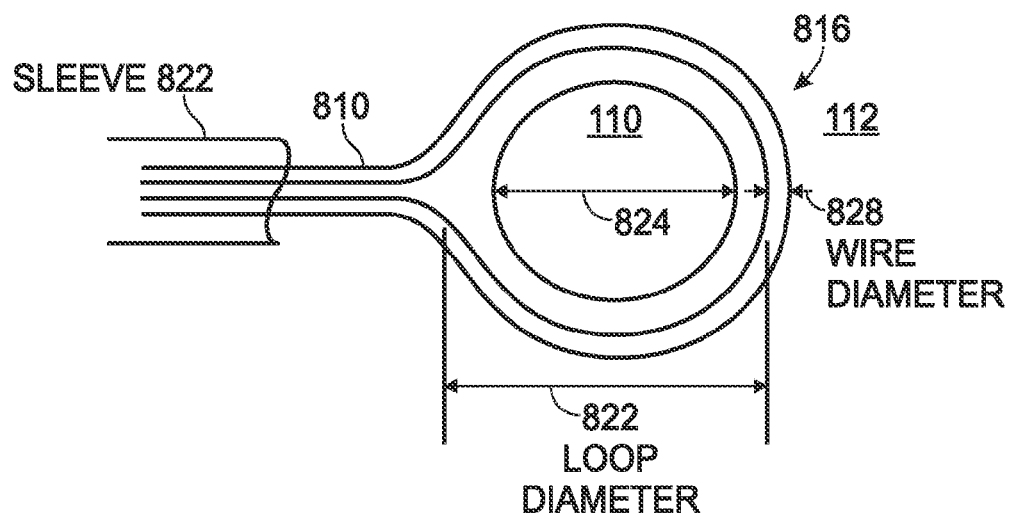

FIGS. 9A and 9B are detailed partial cross-sectional and plan views, respectively, of the connector loop engaged with an IC contact. As shown, the IC contact is a ball grid array (BGA) IC contact. However, the connector can be adapted to interface with any style contact. The loop 816 has a diameter 822 greater than the engaged BGA IC contact diameter 824, so the loop can be slipped over the top 826 of the BGA, past the BGA maximum diameter 824. Typically, the loop 816 is a wire having a wire diameter 828 less than the BGA diameter 824. The smaller wire diameter permits to loop to remain engaged to the BGA contact as the loop is put under tension by the spring. Since the typical BGA contact has a diameter in the range of 10 to 18 micrometers (mils), the loop diameter 822 is in a range between 10 and 30 mils. A first wire or loop diameter of about 6 mils permits a secure engagement to any BGA contact in the above-mentioned range, however, other diameters will also enable the connector.

Returning to FIG. 8, in one aspect a second wire 830 has a first end 832 connected to the spring second end 808, and a second end 832 connected to the post 802. The second wire 830 is useful in circumstances where the electrical resistance of the spring is relatively high. Thus, the spring 804 has a first electrical resistance and the second wire 830 has a second electrical resistance less than the first resistance. The spring 804 has an extension length 834 when the loop is engaged with the IC contact 820. The second wire 830 has a length 836 greater than the spring extension length. Alternately, the second wire length 836 is selected to prevent the spring from being over-extended.

FIG. 10 is a diagram depicting a universal socketless IC test fixture with a contact connector. The details of the test fixture have been described above and depicted in FIGS. 1-4 and 6, and will not be repeated here in the interest of brevity. As above, the test fixture 1000 includes probing platform 102 to accept an IC 104, where the IC 104 has electrical contacts 110 formed on a bottom surface 112 in an array of m rows, where each row includes n, or less contacts. A probe arm 114 includes p probe pins 116, where p is greater than, or equal to n. A clamping mechanism 118 mechanically interfaces the probe arm probe pins 116 to a row of n IC contacts 110 under test.

In addition to the elements depicted in FIGS. 1-4 and 6, this aspect of the test fixture includes the IC contact connector 800 described above and depicted in FIGS. 8, 9A, and 9B. Again, in the interest of brevity, only the basic elements of the connector are highlighted. However, it should be understood that connector of FIG. 10 may include all the aspects and variations mentioned above in the description of FIGS. 8, 9A, and 9B.

As above, the connector 800 has an electrically conductive support post 800. An electrically conductive spring 804 has a first end connected to the post 802, and a second end. An electrically conductive first wire 810 having a first end connected to the spring second end, and a second end. An electrically conductive loop 816 with a loop neck is connected to the first wire second end. The wire ends, springs ends, and loop neck are explicitly labeled in FIG. 8. The probe arm 114, clamping mechanism 118, and probe platform 102 work in cooperation to electrically interface a first row of IC contacts. The spring 804 and loop 816 work in cooperation to engage a single IC contact 110 in a second row of IC contacts. As shown, IC contact 100z in engaged.

As shown, the post 802 is connected to the second interface 124 to enable electrical testing. For example, the post 802 can be connected to the emitter port of a curve tracer. The post 802 is shown mounted on the probe platform, but alternately, the post need not be mechanically interfaced to the probe platform. Although only a single connector 800 is shown, more than one connector may be used. For example, one connector may be interfaced to an IC contact to power the IC, while another connector is connected to an IC ground.

Figure 11:
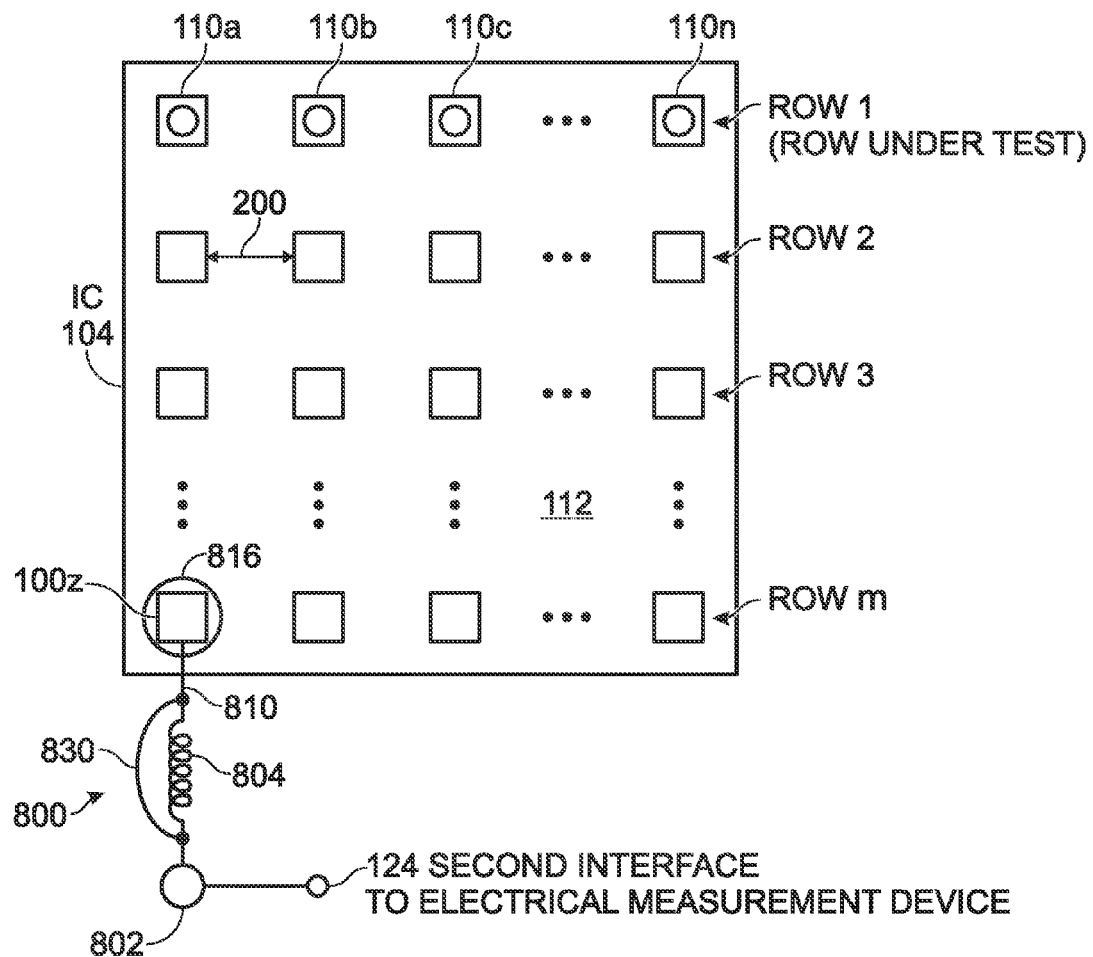
FIG. 11 is a plan view of the IC bottom surface showing the connector engaging IC contact 110z in row m of the IC contacts.

FIG. 11 is a plan view of the IC bottom surface 112 showing the connector 800 engaging IC contact 110z in row m of the IC contacts.

The above-described test fixture makes electrical connections directly to the pins of a package device, using one row of probe pins attached to a probing arm. The probe arm is assembled with the probe pins spacing being the same as that of the package pin pitch. Each row of device pins (contacts) is measured by sequentially stepping the row of probe pins across consecutive rows of package pins. Parametric measurements such as curve tracer analysis may be conducted on each probed pin. The test fixture eliminates the need for sockets and interface boards and permits real-time viewing of the device curves. Further, since the device under test is upside-down (pins up), the probe platform may be a temperature controlled chuck, which permits measurements to be made over temperature.

A universal socketless test fixture and associated IC contact connector have been provided. Examples of waveforms and hardware implementations have been given to illustrate the invention. However the invention is not limited to merely these examples. Other variations and embodiments of the invention will occur to those skilled in the art.

I claim:

1. A socket less integrated circuit (IC) contact connector comprising:
   an electrically conductive support post;
   an electrically conductive spring having a first end connected to the post, and a second end;
   an electrically conductive first wire having a first end connected to the spring second end, and a second end;
   an electrically conductive second wire having a first end connected to the spring second end, and a second end connected to the post;
   an electrically conductive loop with a loop neck connected to the first wire second end; and,
   wherein the spring and loop work in cooperation to engage an IC contact.

2. The connector of claim 1 where the loop is formed by the first wire.

3. The connector of claim 1 further comprising:
   an electrical insulating sleeve overlying the first wire.

4. The connector of claim 1 wherein the loop has a diameter greater than an engaged ball grid array (BGA) IC contact diameter.

5. The connector of claim 4 wherein the loop is a wire having a wire diameter less than the BGA diameter.

6. The connector of claim 5 wherein the first wire forms a loop diameter in a range between 10 and 30 mils; and,
   wherein the first wire has a diameter of about 6 mils.

7. The connector of claim 1 wherein the spring has a first electrical resistance; and,
   wherein the second wire has a second electrical resistance less than the first resistance.

8. The connector of claim 7 wherein the spring has an extension length when the loop is engaged with the IC contact; and,
   wherein the second wire has a length greater than the spring extension length.

9. A universal socketless integrated circuit (IC) test fixture with a contact connector, the test fixture comprising:
   probing platform to accept an IC, the IC having electrical contacts formed on a bottom surface in an array of m rows, where each row includes n, or less contacts;
   a probe arm including p probe pins, where p is greater than, or equal to n;
   a clamping mechanism to mechanically interface the probe arm probe pins to a row of n IC contacts under test;
   an electrically conductive support post;
   an electrically conductive spring having a first end connected to the post, and a second end;
   an electrically conductive first wire having a first end connected to the spring second end, and a second end;
   an electrically conductive second wire having a first end connected to the spring second end, and a second end connected to the post;
   an electrically conductive loop with a loop neck connected to the first wire second end;
   wherein the probe arm, clamping mechanism, and probe platform work in cooperation to electrically interface a first row of IC contacts; and,
   wherein the spring and loop work in cooperation to engage a single IC contact in a second row of IC contacts.

10. The test fixture of claim 9 where the loop is formed by the first wire.

11. The test fixture of claim 9 further comprising:
    an electrical insulating sleeve overlying the first wire.

12. The test fixture of claim 10 wherein the loop has a diameter greater than an engaged ball grid array (BC-A) IC contact diameter.

13. The test fixture of claim 12 wherein the loop is a wire having a wire diameter less than the BCA diameter.

14. The test fixture of claim 13 wherein the first wire forms a loop diameter in a range between 10 and 30 mils; and,
    wherein the first wire has a diameter of about 6 mils.

15. The test fixture of claim 10 wherein the spring has a first electrical resistance; and,
    wherein the second wire has a second electrical resistance less than the first resistance.

16. The test fixture of claim 15 wherein the spring has an extension length when the loop is engaged with the IC contact; and,
    wherein the second wire has a length greater than the spring extension length.

* * * * *

UNITED STATES PATENT AND TRADEMARK OFFICE
CERTIFICATE OF CORRECTION

PATENT NO. : 8,106,671 B2
APPLICATION NO. : 12/541058
DATED : January 31, 2012
INVENTOR(S) : Joseph Patterson It is certified that error appears in the above-identified patent and that said Letters Patent is hereby corrected as shown below:

Claim 1 (column 7, line 52) - the phrase "socket less" should be "socketless".

Claim 12 (column 8, line 49) - the phrase "(BC-A)" should be "(BGA)".

Claim 13 (column 8, line 52) - the phrase "BCA" should be "BGA".

Signed and Sealed this
Sixth Day of March, 2012

David J. Kappos
*Director of the United States Patent and Trademark Office*